(12) United States Patent
Otani et al.

(10) Patent No.: US 6,377,491 B2
(45) Date of Patent: Apr. 23, 2002

(54) NON-VOLATILE MEMORY FOR STORING ERASE OPERATION INFORMATION

(75) Inventors: Hiroshi Otani; Makoto Igarashi; Yoshihiro Tsukidate, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/774,632

(22) Filed: Feb. 1, 2001

(30) Foreign Application Priority Data

Mar. 6, 2000 (JP) ........................................ 2000-060830

(51) Int. Cl.[7] .............................................. G11C 16/04
(52) U.S. Cl. ............................. 365/185.29; 365/185.11; 365/218
(58) Field of Search ...................... 365/185.29, 185.33, 365/185.11, 185.09, 185.22, 218, 230.03

(56) References Cited

U.S. PATENT DOCUMENTS 5,978,273 A * 11/1999 Shigemura ............. 365/185.29
6,118,704 A * 9/2000 Hirata ..................... 365/185.24

FOREIGN PATENT DOCUMENTS

JP      357200994 A  * 12/1982    .......... G11C/11/40
JP      8-101788         4/1996

* cited by examiner

*Primary Examiner*—David Nelms
*Assistant Examiner*—David Lam
(74) *Attorney, Agent, or Firm*—Arent Fox Kintner Plotkin & Kahn, PLLC

(57) ABSTRACT

This invention is nonvolatile memory that has an ordinary memory cell region wherein ordinary data is stored and an erase information storage memory region wherein the information that shows the status of the erase operation is stored. The erase information storage memory region comprises nonvolatile memory that can store the information even when the power is cut. Preferably, the erase information storage memory region can store erase information in the memory block units in which the erase operation is executed. Further preferably, the erase information storage memory region is able to store erase information for at least the three statuses that are involved in erase operations: erase operation start status, preprogramming end status, and erase operation complete status.

2 Claims, 9 Drawing Sheets

NON-VOLATILE MEMORY FOR STORING ERASE OPERATION INFORMATION

BACKGROUND OF THE INVENTION

1. Field of the Invention

The present invention relates to nonvolatile memory such as flash memory, and more particularly to nonvolatile memory that can store information relating to the history of erase operations.

2. Description of the Related Art

A flash memory, which is a nonvolatile memory device, not only can hold stored information even when the power is off, but also is smaller and can read information more quickly than a hard disk, and is therefore widely used as semi-conductor memory in mobile telephones and digital cameras.

Conventional flash memory writes information by applying a program pulse to cell in an erased state. Memory blocks are rewritten by applying a program pulse to the desired cells after firstly erasing the entire memory block. Flash memory can also erase a specified memory block in response to an external erase command. Usually, an erased state is data 1 and a written state (programmed state) where a program pulse has been applied is data 0. Writing and programming are used with the same meaning.

The above block erase operation comprises a preprogram process in which cell data in the memory block is read and all cells in an erased state are programmed (made into data 0) and an erase process in which all cells are then erased (made into data 1) while an erase pulse is applied to all cells in the memory block. When these two processes end normally, the block erase operation ends normally. Then, after that, data can be written to the memory block. In this erase operation an internal control circuit comprising a microprocessor executes a series of sequence programs in response to an erase command.

However, an erase operation can be interrupted when, for example, the power is cut during the above series of erase operations. Erase operations can also be interrupted when a user decides that the erase operation has failed because for some reason it does not end within a certain time. When an erase operation is thus interrupted, the state of cells within the memory block is not clear and information cannot be read normally from these memory cells of unclear state even after a program operation is executed. Also, when information cannot be read normally it is difficult to diagnose the cause. In particular, when interruption during an erase operation causes the threshold voltage to be neither data 1 nor data 0, a special detection circuit is required to detect the stage at which the error occurred. It is not practical to build such detection circuit into the device.

Of course, if it is determined that an erase operation was interrupted, cells can be returned to their normal erased state by executing the erase operation again, i.e. preprogramming all memory cells within the memory block, and then erasing all memory cells simultaneously. However, it is difficult to detect if an erase operation has been interrupted or at what stage of an erase operation it has been interrupted and therefore, when reading fails it is not efficient practice to repeat a block erase operation under the assumption that an erase operation has been interrupted.

SUMMARY OF THE INVENTION

An object of the present invention is to provide a nonvolatile memory that can easily determine whether or not an erase operation has been interrupted.

A further object of the present invention is to provide a nonvolatile memory that can easily detect the stage at which an erase operation was interrupted.

To achieve the above objects, one aspect of this invention is nonvolatile memory that has an ordinary memory cell region wherein ordinary data is stored and an erase information storage memory region wherein the information that shows the status of the erase operation is stored. The erase information storage memory region comprises nonvolatile memory that can store the information even when the power is cut.

Preferably, the erase information storage memory region can store erase information in the memory block units in which the erase operation is executed. Further preferably, the erase information storage memory region is able to store erase information for at least the three statuses that are involved in erase operations: erase operation start status, preprogramming end status, and erase operation complete status.

In another preferred embodiment, the erase information in the erase information storage memory region can be read out to an external device, or read out to an external device in response to a prescribed command. Alternatively, the erase information can be read internally in response to the switching on of power or another prescribed command and then output the information to an external device when the erase information indicates a memory block in which an erase operation has been interrupted.

Furthermore, in another preferred embodiment, the erase information is read internally in response to a switching on of power or another prescribed command and, when the erase information indicates a memory block in which an erase operation has been interrupted, an erase operation can be automatically executed for that memory block.

The above nonvolatile memory stores erase information such as whether or not erase operations have ended normally for each memory block or the stage to which an erase operation has progressed, thereby simplifying diagnosis when a failure occurs and enabling an efficient return to a normal state.

DESCRIPTION OF THE PREFERRED EMBODIMENTS

An aspect of the embodiment of the present invention is described hereinbelow with reference to the figures. However, this aspect of the embodiment does not limit the technical scope of the present invention.

Figure 1:
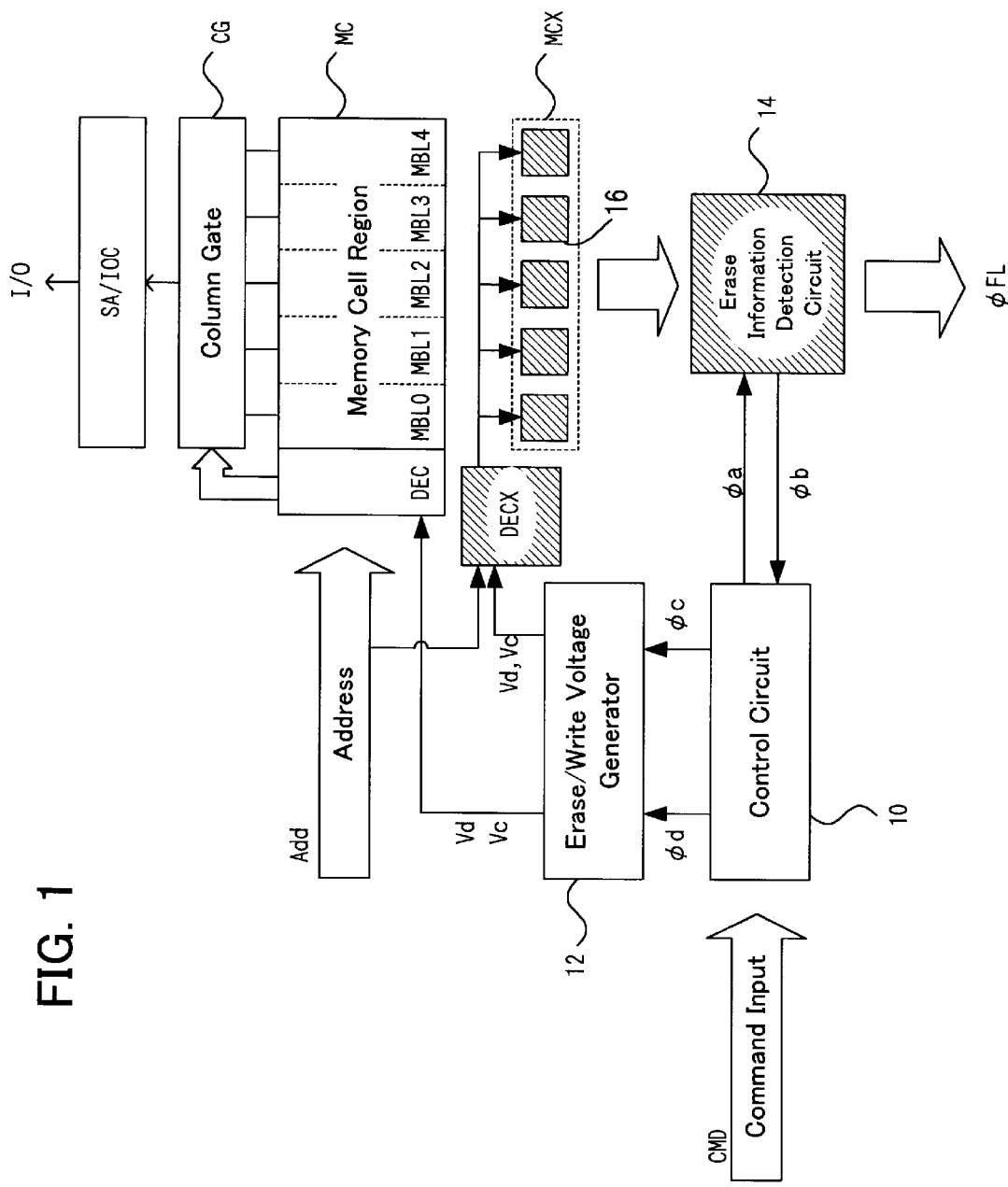
FIG. 1 is a schematic general view of the nonvolatile memory device in a first aspect of the embodiment.

FIG. 1 is a schematic view of the whole nonvolatile memory device in a first aspect of the embodiment. The memory device shown in FIG. 1 has an ordinary memory cell region MC for storing ordinary data and an erase information storage memory cell region MCX for storing information that shows the status of erase operations and information that shows whether or not a series of erase operations has been completed. The ordinary memory cell region MC has, for example, a plurality of memory blocks MBL0 through MBL4 and erasure is conducted in each memory block unit. The erase information storage memory cell region MCX has storage bits 16 wherein erase information for each memory block is stored. When the erase information comprises two bits, the storage bit 16 for each memory block also comprises two-bit cells.

A decoder DEC is provided in the ordinary memory cell region MC. An address Add from an external device is decoded and a bit line and word line not shown in the figure are selected. The column gate CG selectively connects a selected bit line to a sense amplifier and input-output circuit SA/IOC. The sense amplifier and input-output circuit SA/IOC output read data to an external device and input write data from an external device.

The memory device has a control circuit 10 comprising a processor that internally controls write operations (program), read operations, and erase operations. By executing sequence programs corresponding to commands in response to commands supplied from an external device, the control circuit 10 controls the above operations. In response to an erase or write control signal Ød from control circuit 10, the erase and write voltage generating circuit 12 produces a voltage Vd, Vc other than the power voltage required for an erase operation or for a write operation and supplies it to the memory cell region MC.

The memory device shown in FIG. 1 has a decoder DECX for selecting the storage bit 16 of the erase information storage memory region MCX. This decoder DECX is supplied with an address for selecting a block from an external device, selects the storage bit 16 that corresponds to the selected memory block, then executes a write operation (program), erase operation, and read operation to the storage bit 16.

The erase information from the erase information storage memory region MCX is read by the erase information detection circuit 14. This erase information detection circuit 14: (1) sends the read erase information to an external device as it is; (2) sends a flag ØFL showing that the erase operation is not complete when the read erase information indicates incomplete erase operation; and (3) supplies an erase start signal Øb to the control circuit 10 when the erase operation is incomplete and makes the control circuit 10 automatically conduct the erase operation. Any of these operations may be carried out or any may be executed in response to an external command.

The control circuit 10 sends an erase information detection signal Øa to the erase information detection circuit 14 in response to an external command. In response to this erase information detection signal Øa, the erase information detection circuit 14 executes any of the above operations. In the case of function (3) above, the erase information detection circuit 14 generates an erase start signal Øb and, in response to this, the control circuit 10 generates a control signal Ød for executing an operation to erase the selected memory block. An erase voltage Vd is then generated by the erase/write voltage producing circuit 12.

Figure 2:
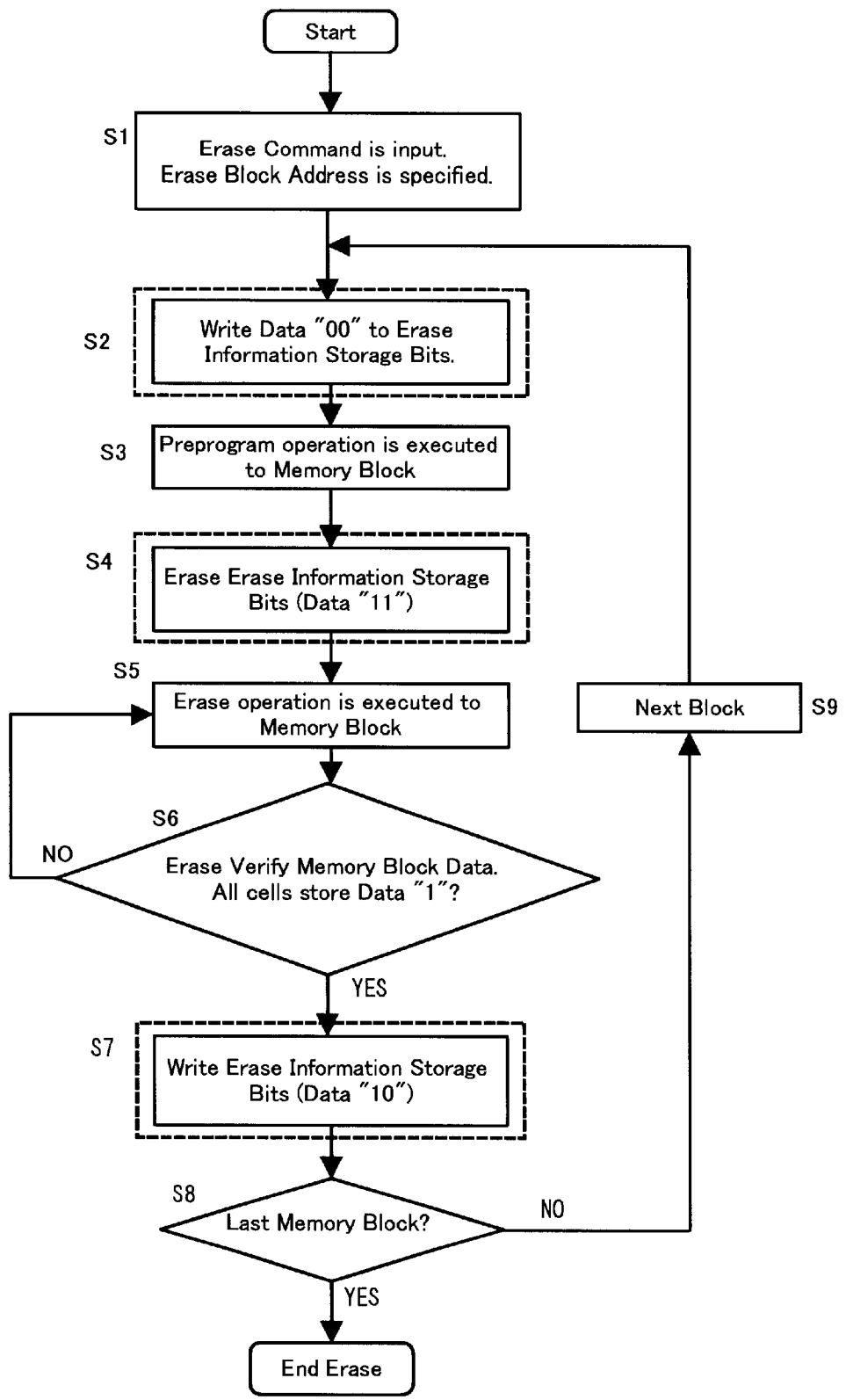
FIG. 2 is a flow chart of an erase operation using the memory device of FIG. 1.

FIG. 2 is a flow chart of the erase operation in the memory device of FIG. 1. When an erase block address is specified as an erase command is input from an external device (S1), the control circuit 10 generates an erase information control signal Øc, the erase and write voltage generating circuit 12 generates a write voltage Vc, and data "00" is written into the erase information storage bit 16 that corresponds to the specified memory block. The erase information memory region MCX has an identical memory cell structure to that of an ordinary memory cell region MC and data "00" is written (programmed) in it using the same program control (S2).

Preprogramming of the specified block is then executed (S3). In preprogramming, memory cell data in the block is read. When the data is 1 (erase status), a write pulse is applied to that memory cell and data 0 is written. This preprogramming is executed out for all memory cells. Accordingly, when preprogramming ends normally, data (data 0) will have been written in all memory cells in the memory block.

When the memory block preprogramming process S3 ends, the control circuit 10 generates an erase information control signal Øc so that an erase voltage Vd is generated, and the memory cells in the corresponding erase information storage bit 16 are erased and converted to data "11" (S4). As a result, the erase information that shows that the preprogramming process has ended normally for the specified memory block is stored in the erase information storage bit 16.

Next, the erase pulse is simultaneously applied to all memory cells within the memory block and to carry out the erase operation (S5). In response to the control signal Ød from the control circuit 10, the erase/write voltage generating circuit 12 produces erase voltage Vd and an erase pulse is applied to the memory cells. Voltages Vc and Vd are write or erase voltages that correspond to control signals. In the erase operation, an erase pulse is applied simultaneously to all memory cells within the block, verifying whether or not all memory cells have been erased (data 1) (S6).

When the erase operation for memory cells within the specified memory block ends normally, data 0 is written into one cell in the corresponding erase information storage bit 16, for example making the data "10". As a result, the fact that the erase operation has ended normally is stored.

When another memory blocks has been specified, the address of that memory block is specified (S9), and the above processes S2 through S7 are repeated by determining if the last memory block has been processed (S8).

Figure 3:
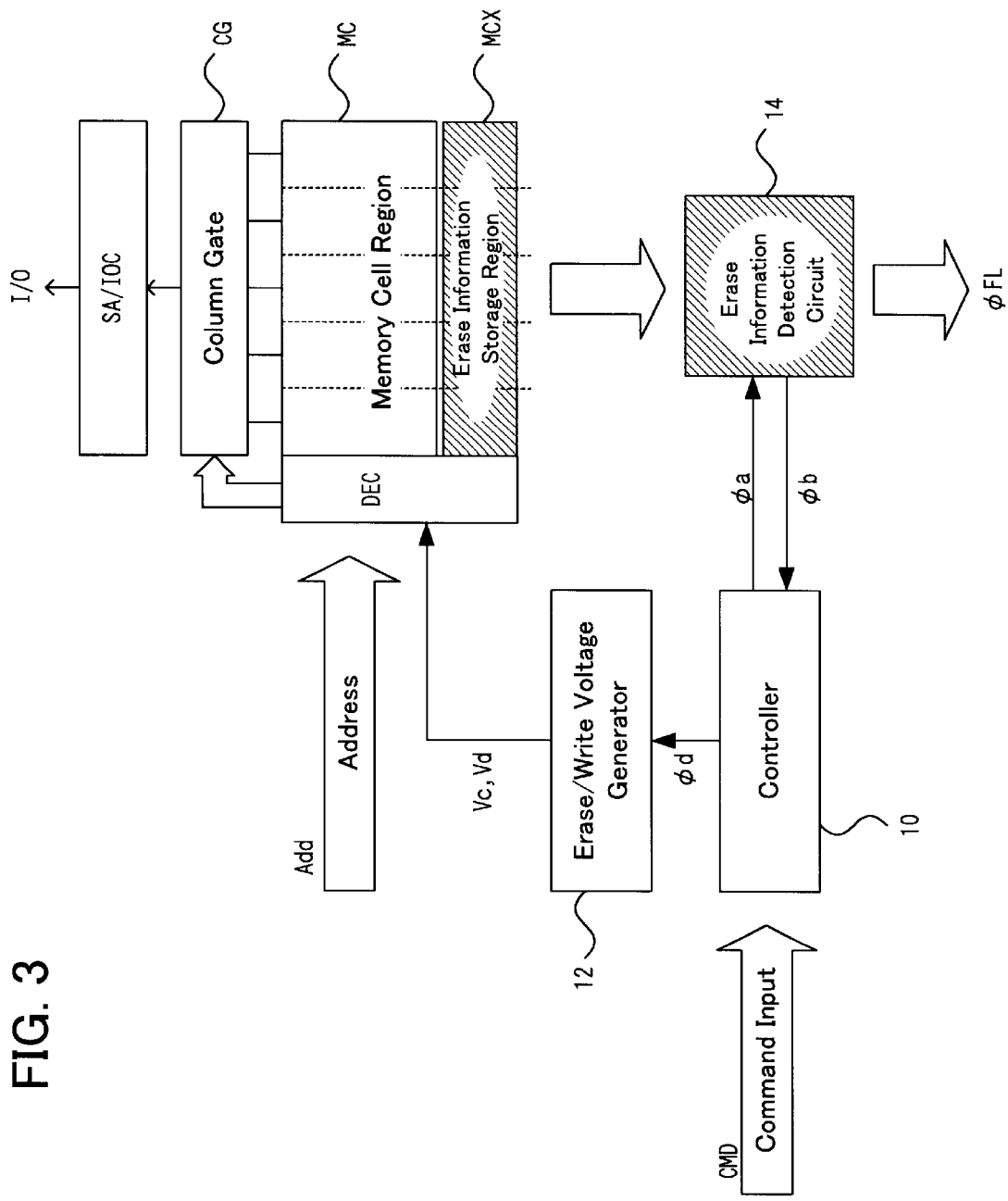
FIG. 3 is a schematic general view of the nonvolatile memory device in a second aspect of the embodiment.

FIG. 3 is a schematic general view of the nonvolatile memory device in second aspect of the embodiment. In the memory device of FIG. 3, within the memory cell region MC wherein ordinary data is stored, there is an erase information memory region MCX wherein information (erase information) showing the status of an erase operation or information showing whether or not a series of erase operations has been completed is stored. Accordingly, writing to or erasure of data in the erase information memory region MCX can be done at the same time as writing to or erasure of data in the ordinary memory cell region MC. Other configurations are the same as the first aspect of the embodiment shown in FIG. 1.

Figure 4:
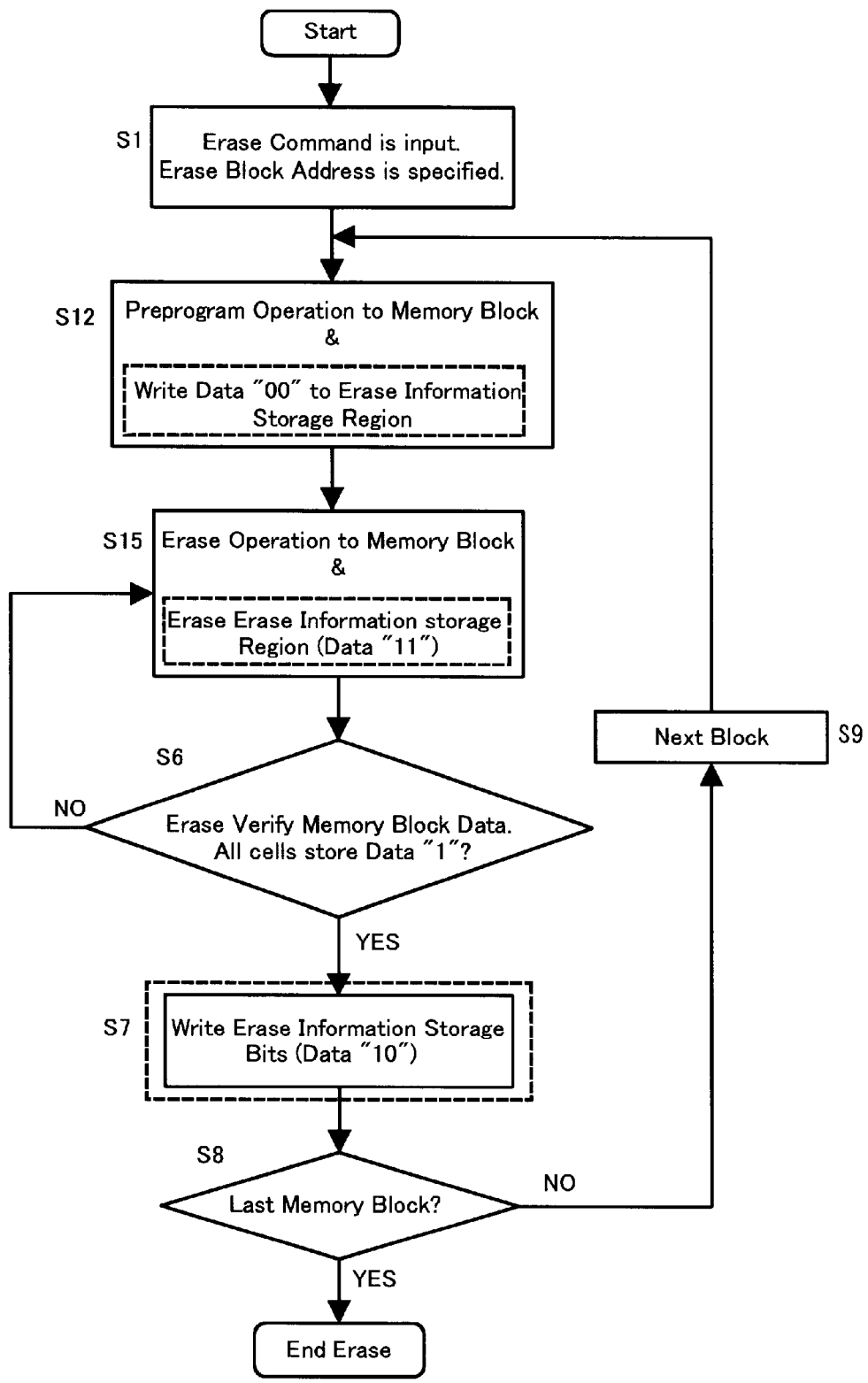
FIG. 4 is a flow chart of an erase operation using the memory device of FIG. 2.

FIG. 4 is a flowchart of the erase operation for the memory device in the second aspect of the embodiment. The same reference numbers are given for the same processes as in FIG. 2. In the second aspect of the embodiment, the memory device has an erase information memory region MCX in the ordinary memory cell region MC. Accordingly, in the preprogramming process S12 or the erase process S15, preprogramming and erasure of erase information memory cells is implemented at the same time as preprogramming and erasure of ordinary memory cell region.

When the erase command is entered and the erase block address is specified (S12), the specified memory block is preprogrammed (S12). In preprogramming, data in the memory cell is read, a program pulse is applied to the memory cell with data 1 (erased state), and data 0 is written. Here, preprogramming starts from the erase information memory cell MCX in the specified memory block. Accordingly, the erase information memory cell MCX is first preprogrammed, and the erase information becomes data "00". Preprogramming is then carried out in the ordinary memory region.

Next, the specified memory block is completely erased (S15). In this process, erase pulses are simultaneously applied to the ordinary memory cells within the specified memory block and to the erase information memory cells MCX. Verification of erasure starts from the erase information memory cells. Accordingly, after confirmation that the erase information memory cell MCX has been erased, erasure of the ordinary memory cell region is verified. The fact that preprogramming has ended normally can be detected from the erase information memory cell MCX data "11".

When all the memory cells in the specified memory block pass the erasure verification S6, that means that the erase operation has ended normally. Accordingly, specific data "10" or "01" is written in the erase information memory cell MCX in the specified memory block (S7). These steps, including steps S8–S9 are the same as in FIG. 2. With this specific data, it is confirmed that all erase operations have ended normally.

Next, it will be discussed a diagnose function by using the erase information stored in the erase information memory cell region.

Figure 5:
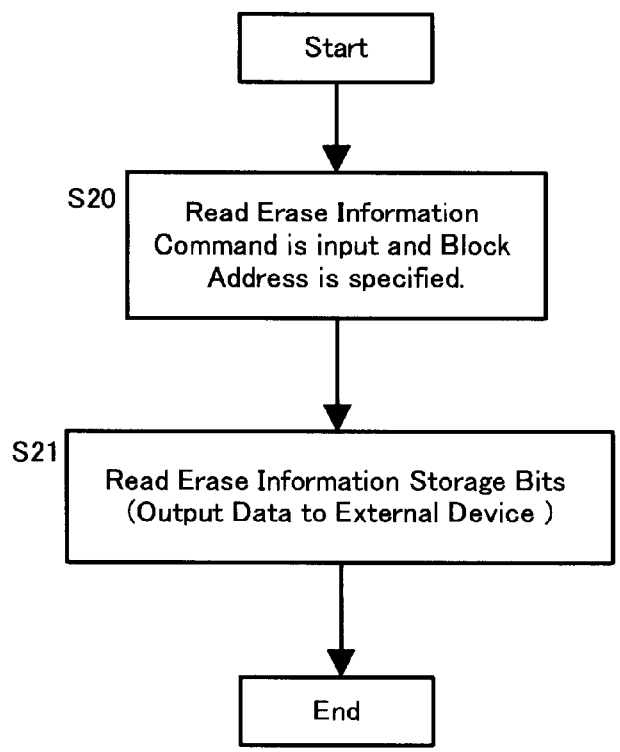
FIG. 5 is a flow chart that shows a first function of the erase information detection circuit.

FIG. 5 is a flow chart showing a first function of the erase information detection circuit. In response to a read erase information command (S20), the control circuit 10 generates an erase information detection signal Øa. In response to this, the erase information detection circuit 14 reads the data in the erase information storage bit 16 that corresponds to the memory block specified by the block address and sends this to an external device (S21). Accordingly, either data "00", "11", or "10", is read in the erase information storage bit 16. These data types respectively show the erase process start status, the preprogram end status, and the erase process end status. Accordingly, when a failure is found in the memory device, reading this erase information enables an understanding of the stage in the erase process at which processing of the memory block has ended and thus allows simple failure diagnosis. If it is found that the erase process did not end normally, the failure status can be removed by erasing that memory block again.

Figure 6:
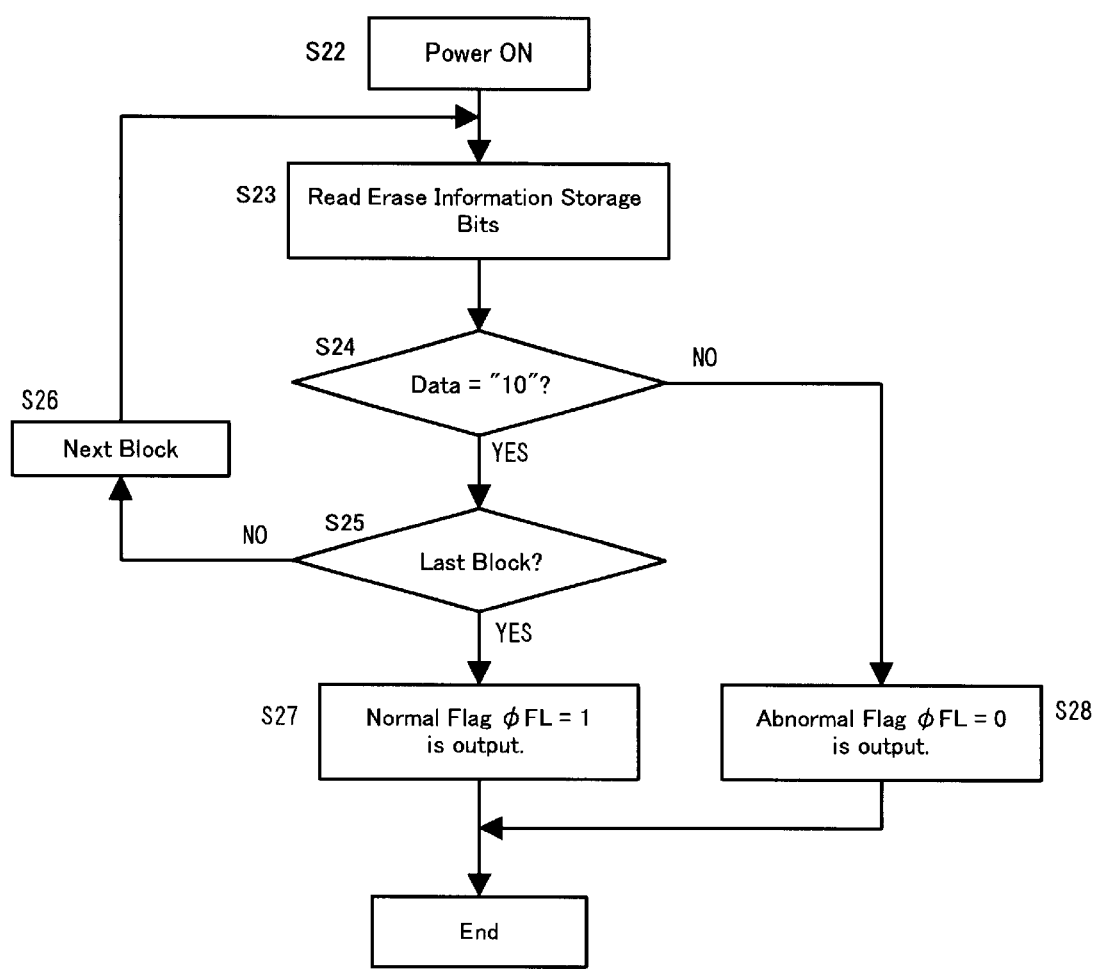
FIG. 6 is a flow chart showing a second function of the erase information detection circuit.

FIG. 6 is a flowchart showing a second function of the erase information detection circuit. With this function, when the power is turned on, the erase information detection circuit 14 checks the data in the erase information storage bits corresponding to all memory blocks. An abnormal flag signal ØFL is output from the flag output terminal if data "00" or "11", which indicate that the erase operation did not finish normally, is detected and a normal flag signal is output if data "10" is detected.

The following explanation follows the flowchart given in FIG. 6. When the power is turned on (S22), the control circuit 10 produces an erase information detection signal Øa and the erase information detection circuit 14 reads the data in the erase information storage bit (S23). When the data read is "10" (S24), this means that the erase operation has finished normally for that memory block and so, if another memory block has been specified (S25), the data in the erase information storage bit corresponding to the next block is read (S26). If the read erase information data is anything other than "10", an abnormal flag ØFL (=0) is output from the flag output terminal (S28). If the erase information data is "10" for all memory blocks, a normal flag ØFL (=1) is output from the flag output terminal (S27).

Figure 7:
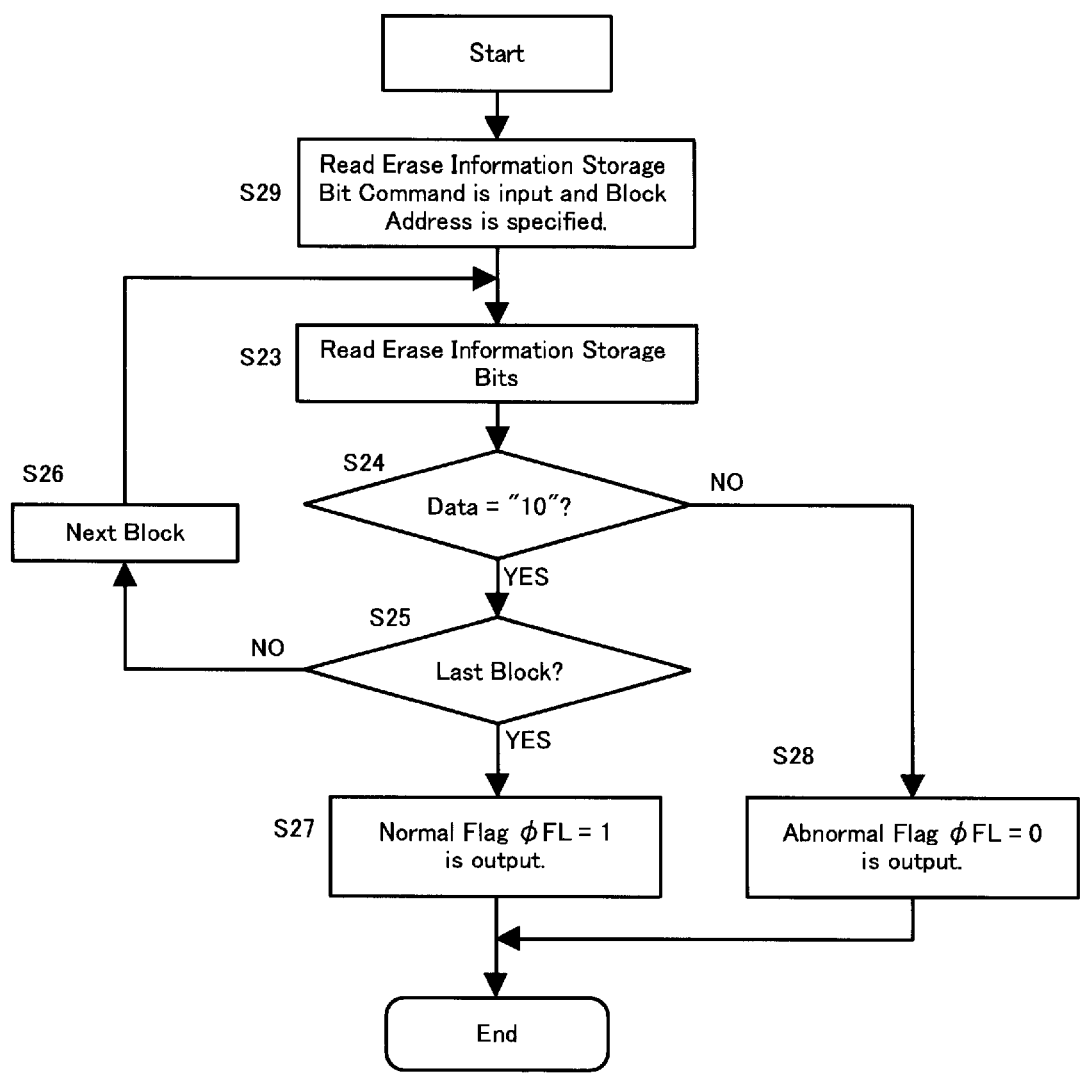
FIG. 7 is a flow chart of a modification of FIG. 6.

FIG. 7 is a flowchart of a modification of FIG. 6. In this example, the erase information data for the specified memory block is read in response to an erase information read command, rather than in response to the power being turned on (S29), and it is detected whether the erase operation has been performed normally or abnormally. Accordingly, only process S29 is different than FIG. 6. All other operations are the same.

Figure 8:
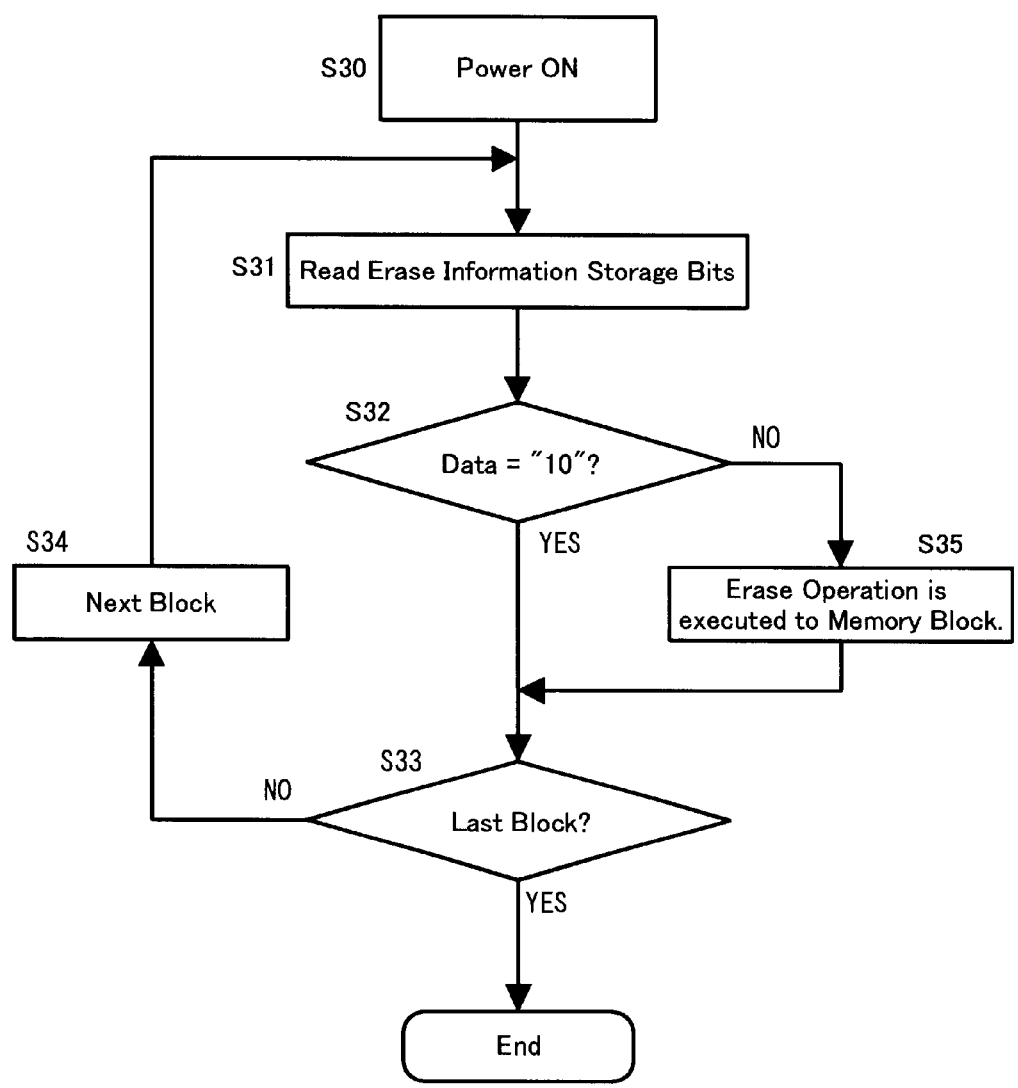
FIG. 8 is a flow chart showing a third function of the erase information detection circuit.

FIG. 8 is a flowchart of a third function of the erase information detection circuit. With this function, when the power is turned on to the device (S30), the control circuit 10 generates an erase information detection signal Øa. In response to this signal, the erase information detection circuit 14 reads the data in the erase information storage bit (S31), and checks if the read data is "10" which shows that erasure has finished normally (S32). When the read data is not "10", the erase information detection circuit 14 generates an erase start signal Øb to enable erasure of that memory block. In response, the control circuit 10 implements an erase operation as shown in FIGS. 2 and 4 (S35).

When the data is "10", the erase information storage bit of the next memory block is read (S34). As described above, erase information is checked for all memory blocks and an erase operation is conducted for memory blocks where erasure has not ended normally (S33).

Figure 9:
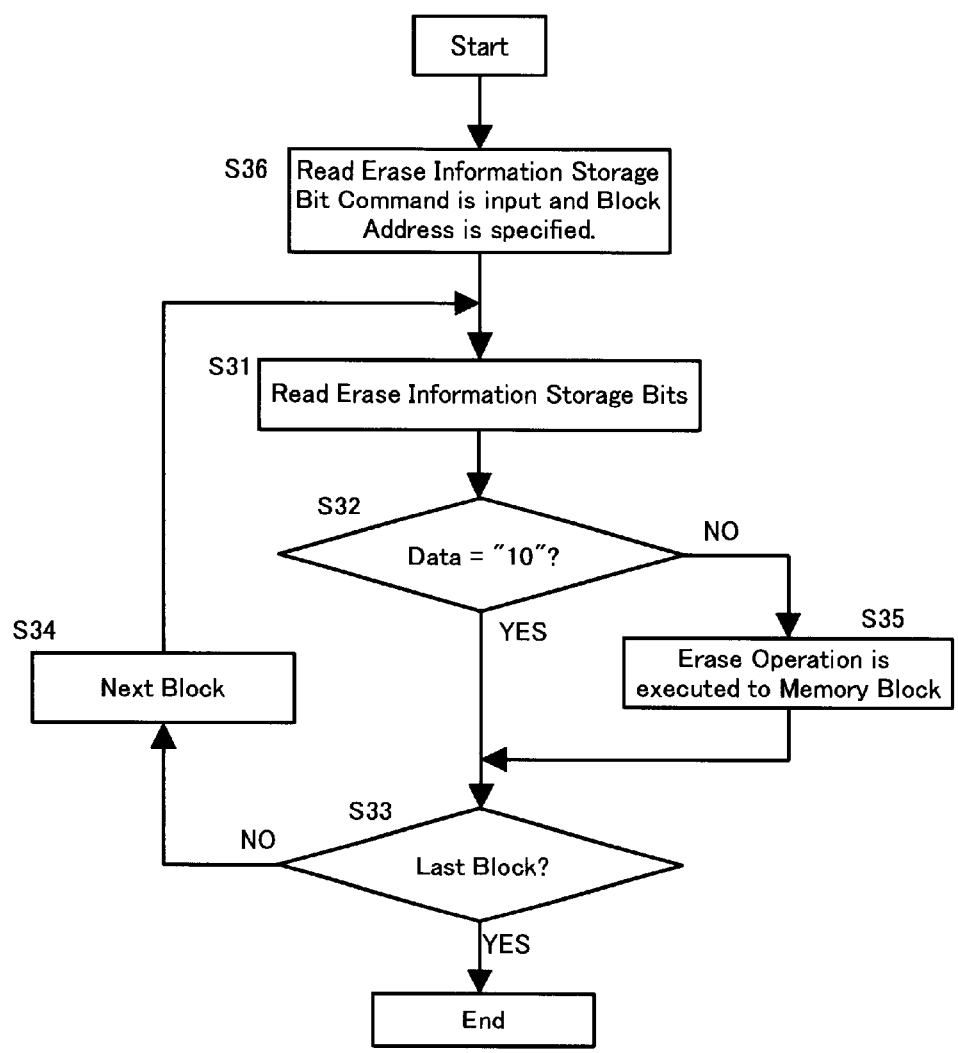
FIG. 9 is a flow chart of a modification of FIG. 8.

FIG. 9 is a flowchart of a modification of FIG. 8. In this example, the erase information storage bits for specified memory blocks are checked in response to an erase information read command (S36) rather than in response to the power being turned on. Memory blocks are then automatically erased if a failed erase status is detected. All other operations are implemented in the same manner as in FIG. 8.

With the third function above, because the erase information detection circuit 14 checks the data in the erase information storage bits for all memory blocks and the memory blocks are automatically erased again if there is a failed erase status, the memory can be returned to normal status efficiently.

As explained above, the present invention can be used to detect whether or not an erase operation has ended normally, or to detect the stage to which an erase operation has been implemented in a nonvolatile memory device, such as flash memory, and the failure diagnosis can be carried out efficiently.

The scope of protection for the present invention is not limited to the above aspects of embodiment but shall extend to include the invention as claimed in the patent claims and any equivalents.

What is claimed is:

1. Nonvolatile memory wherein an erase operation is implemented prior to a write operation, comprising:

an ordinary memory cell region for storing ordinary data;

an erase information storage memory region for storing information that shows whether or not a series of erase operations has been completed or information that shows the status of the erase operations; and an erase information detection circuit which reads erase information in said erase information storage memory region in response to a prescribed command or to power being turned on and, when the erase information indicates that an erase operation has been interrupted, sends that interruption information to an external device.

2. Nonvolatile memory wherein an erase operation is implemented prior to a write operation, comprising:

an ordinary memory cell region for storing ordinary data;

an erase information storage memory region for storing information that shows whether or not a series of erase operations has been completed or information that shows the status of the erase operations; and an erase information detection circuit which reads erase information in the said erase information storage memory region in response a prescribed command or to power being turned on and, when the erase information indicates that an erase information has been interrupted, causes the ordinary memory cell region to be executed that erase information.

* * * * *